US010718503B2

(12) United States Patent
Brown

(10) Patent No.: US 10,718,503 B2
(45) Date of Patent: Jul. 21, 2020

(54) FLEXIBLE LIGHT-EMITTING FILM

(71) Applicant: Canatu Oy, Vantaa (FI)

(72) Inventor: David P. Brown, Helsinki (FI)

(73) Assignee: Canatu Oy, Vantaa (FI)

( * ) Notice: Subject to any disclaimer, the term of this patent is extended or adjusted under 35 U.S.C. 154(b) by 176 days.

(21) Appl. No.: 14/891,103

(22) PCT Filed: May 14, 2014

(86) PCT No.: PCT/FI2014/050362
§ 371 (c)(1),
(2) Date: Nov. 13, 2015

(87) PCT Pub. No.: WO2014/184440
PCT Pub. Date: Nov. 20, 2014

(65) Prior Publication Data
US 2016/0091189 A1    Mar. 31, 2016

(30) Foreign Application Priority Data

May 14, 2013 (FI) ..................................... 20135510

(51) Int. Cl.
*F21V 23/04*    (2006.01)
*G06F 3/041*    (2006.01)
(Continued)

(52) U.S. Cl.
CPC ........ *F21V 23/0485* (2013.01); *F21V 14/003* (2013.01); *G06F 3/041* (2013.01);
(Continued)

(58) Field of Classification Search
CPC ............... G02F 1/133305; G02F 1/155; G06F 2203/04102; G06F 2203/04103;
(Continued)

(56) References Cited

U.S. PATENT DOCUMENTS

2006/0250534 A1  11/2006  Kutscher et al.
2006/0274049 A1  12/2006  Spath et al.
(Continued)

FOREIGN PATENT DOCUMENTS

CN          1636163 A    7/2005
CN        101950794 A    1/2011
(Continued)

OTHER PUBLICATIONS

Extended European Search Report for corresponding European Application No. 14798186.4 dated Feb. 7, 2017, 13 pages.
(Continued)

*Primary Examiner* — Jong-Suk (James) Lee
*Assistant Examiner* — Christopher E Dunay
(74) *Attorney, Agent, or Firm* — Alston & Bird LLP

(57) ABSTRACT

A touch controllable light-emitting film is provided. It comprises a flexible, formable, foldable, stretchable and/or bendable light-emitting and/or light transmitting active layer. It also comprises at least two conductive or semiconductive electrodes positioned on each side of the light-emitting active layer and/or light-blocking layer, wherein at least one electrode comprises HARMs (High Aspect Ratio Molecular structures), Monolayer Crystalline Surface (MCS) structures, transparent conductive oxides, conductive or semiconductive polymers and/or a metal mesh.

16 Claims, 5 Drawing Sheets

(51) Int. Cl.
*G06F 3/0488* (2013.01)
*G06F 3/0489* (2013.01)
*F21V 14/00* (2018.01)
*H05B 33/28* (2006.01)
*H01L 27/32* (2006.01)

(52) U.S. Cl.
CPC ...... *G06F 3/04883* (2013.01); *G06F 3/04897* (2013.01); *H05B 33/28* (2013.01); *G06F 2203/04102* (2013.01); *H01L 27/323* (2013.01)

(58) Field of Classification Search
CPC ......... G06F 2203/04112; G09F 13/222; G09F 13/225; G09F 9/33; G09F 13/22; G09G 3/3208; H01L 2251/5338; H01L 27/1562; H01L 27/3265; H01L 31/022466; H05B 33/10; H05B 33/12; H05B 33/145; H05B 33/20
See application file for complete search history.

(56) References Cited

U.S. PATENT DOCUMENTS

| | | | |
|---|---|---|---|
| 2008/0018232 | A1 | 1/2008 | Zhang et al. |
| 2010/0097346 | A1* | 4/2010 | Sleeman ............... G06F 3/0412 345/174 |
| 2010/0188354 | A1* | 7/2010 | Tamura ............... G02F 1/13338 345/173 |
| 2010/0283762 | A1* | 11/2010 | Takusa .................... G06F 3/044 345/174 |
| 2011/0007012 | A1 | 1/2011 | Shih |
| 2011/0319128 | A1* | 12/2011 | Miwa .................. H04M 1/6008 455/550.1 |
| 2012/0105370 | A1 | 5/2012 | Moore |
| 2012/0204950 | A1 | 8/2012 | Magdassi et al. |
| 2012/0242610 | A1 | 9/2012 | Yasumatsu |
| 2013/0010474 | A1 | 1/2013 | Bodkin |
| 2013/0050113 | A1 | 2/2013 | Brown |
| 2013/0321343 | A1* | 12/2013 | Miyamoto ............ G06F 3/0416 345/175 |
| 2014/0078424 | A1 | 3/2014 | Qian |

FOREIGN PATENT DOCUMENTS

| | | |
|---|---|---|
| CN | 102236472 A | 11/2011 |
| GB | 2470317 A | 11/2010 |
| JP | 2011/204664 | 10/2011 |
| JP | 2012/524323 | 10/2012 |
| TW | 2008 14393 A | 3/2008 |
| TW | 2009 29647 A | 7/2009 |
| TW | 201222385 A | 6/2012 |
| WO | WO 2007/004758 | 1/2007 |
| WO | WO 2009/056686 A1 | 5/2009 |
| WO | WO 2011/107665 A1 | 9/2011 |
| WO | WO 2011/107666 A1 | 9/2011 |
| WO | WO 2011/112589 | 9/2011 |
| WO | WO 2012/040637 A2 | 3/2012 |
| WO | WO 2013/010474 | 1/2013 |
| WO | WO 2013/045766 A2 | 4/2013 |
| WO | WO 2013/117815 A1 | 8/2013 |

OTHER PUBLICATIONS

Office Action for corresponding Finnish Application No. 20135510 dated Mar. 3, 2017, 7 pages.
Written Opinion for corresponding International Application No. PCT/FI2014/050362, dated Aug. 20, 2014.
Office Action in Taiwanese Application No. 103116956 dated Apr. 12, 2017.
Office Action for Chinese Application No. 201480027643.3 dated Jul. 4, 2017, 12 pages total.
Azoubel, S. et al., *Flexible electroluminescent device with inkjet-printed carbon nanotube electrodes*, Nanotechnology, vol. 23, No. 34 (2012) 1-6.
International Search Report for corresponding International Application No. PCT/FI2014/050362, dated Aug. 20, 2014.
Search Report 1 for corresponding Finnish Application No. 20135510 dated Mar. 13, 2014, 2 pages.
Search Report 2 for corresponding Finnish Application No. 20135510 dated May 21, 2015, 2 pages.
Yu, Z. et al., *Fully bendable polymer light emitting devices with carbon nanotubes as cathode and anode*, American Institute of Physics, vol. 95 (2009) 4 pages.
Yu, Z. et al., *Intrinsically Stretchable Polymer Light-Emitting Devices Using Carbon Nanotube-Polymer Composite Electrodes*, Advanced Materials, vol. 23 (2011) p. 3989-3994.
Office Action for Japanese Application No. 2016-513414 dated Sep. 11, 2018.
Office Action for European Application No. 14 798 186.4 dated Jan. 31, 2018, 8 pages.
Hagman, A. et al., "Experimental and numerical verification of 3D forming" [online] [retrieved Feb. 2018]. Retrieved from Internet:<URL:https://www.researchgate.net/publication/323336434_Experimental_and_numerical_verification_of_3D_forming.html>(2018).
Throne, J.L., et al., "Vacuum Forming" [online] [retrieved Dec. 12, 2018] <URL:https://en.wikipedia.org/wiki/Vacuum_forming. (Dec. 12, 2018).
Office Action for European Application No. 14 798 186.4 dated Jul. 19, 2018, 11 pages.
TW Application No. 103116956 Examination Report dated Aug. 30, 2019.

* cited by examiner

FLEXIBLE LIGHT-EMITTING FILM

BACKGROUND OF THE INVENTION

There has been an increasing demand for flexible and formable light-emitting structures. Certain prior art structures, such as OLEDs (Organic Light-Emitting Diodes), are known to have quite flexible active light-emitting layers. Similarly, light blocking layers, such as Liquid Crystals combined with polarizing surfaces, can be flexible. However, the electrodes used in these devices that need to be optically transparent may severely limit the ability to bend, stretch, flex, fold and/or form these structures. Many problems may occur if the electrodes known in the art, such as transparent conductive oxides like ITO, are bent too much, bent in two different directions at once, or formed over a complex 3D (three-dimensional) surface. Problems such as cracking and delaminating are common.

It is also desirable to make touch-sensitive flexible and/or formable light emitting devices. A typical example is the dome light of an automobile or a desk or reading lamp in a home or office. The ability to adjust the lighting conditions in a luminaire or other lighting device by touch interaction adds safety, convenience, usefulness and aesthetic pleasure.

Existing solutions for light adjustment in lighting devices are limited to buttons, switches, dials and touch surfaces separate from the lighting source. This detaches the user input from direct adjustment of the light source and limits intuitive control.

A means of giving a user direct and intuitive control of the light source adjustments is beneficial to industry and commerce.

SUMMARY OF THE INVENTION

The present invention addresses the abovementioned problems and the challenges of the prior art and provides a novel flexible and/or formable light-emitting or light blocking film that can have various applications.

According to an embodiment of the present invention, a light-emitting and/or light blocking film is provided. It comprises a flexible, formable, foldable, stretchable and/or bendable light-emitting or light-blocking active layer; and two conductive or semi-conductive electrodes positioned on each side of the light-emitting or light-blocking active layer, wherein at least one electrode comprises HARMs (High Aspect Ratio Molecular structures), MCSs (Monolayer Crystalline Surface structures) and/or one or more conductive or semiconductive polymers and/or a metal mesh. A current and/or voltage is controlled from a power source between the electrodes to generate light in a light-emitting active layer in a light-emitting embodiment or block light from a light source behind the light-blocking layer in a light-blocking embodiment.

A flexible, foldable, formable, stretchable and/or bendable light-emitting active layer can be, for example, an OLED (organic light-emitting diode) layer, an EL (electroluminescent) layer, a FE (Field Emission) layer or a plasma layer. The properties of the above active layers are known, and their e.g. flexibility has been shown in the prior art. A flexible, foldable, formable, stretchable and/or bendable light-emitting layer can also comprise an array of non-flexible components on a flexible, foldable, formable, stretchable and/or bendable substrate, for instance LEDs imbedded in or otherwise attached to such a substrate.

A flexible, foldable, formable, stretchable and/or bendable light-blocking active layer can be, for example, a liquid crystal active layer, e.g. a nematic liquid crystal layer. The properties of the above active layers are known, and their e.g. flexibility has been shown in the prior art.

The two or more conductive or semi-conductive electrodes can be positioned on the sides of the active layer. They can be in physical contact with it or have a gap or other layers in between. The electrodes comprising HARM-structures can provide high flexibility in more than 1 direction at a time and, particularly in the case of, for instance, Carbon Nanotubes and NanoBuds, ability to form, stretch, bend and fold the film, good conductivity, low surface roughness and high optical transparency. HARM-structures include, but are not limited to, carbon nanotubes (CNTs), fullerenes ($C_{60}$), Nanobuds (Nanobud is a trademark registered by Canatu Oy)—hybrids of CNTs and $C_{60}$, nanowires, nanowhiskers etc. Electrodes may also comprise monolayer crystalline surface structures. Examples of so called monolayer crystalline surface (MCS) structures include essentially two-dimensional lattices of carbon (e.g. graphene), nitrogen and boron. Electrodes comprising polymers, metal meshes, or weaved metal fabric provide certain advantages in terms of cost and/or printablility. Polymers include, but are not limited to, Poly(fluorene)s, polyphenylenes, polypyrenes, polyazulenes, polynaphthalenes, poly(pyrrole)s (PPY), polycarbazoles, polyindoles, polyazepines, polyanilines (PANI), poly(thiophene)s (PT), poly(3,4-ethylenedioxythiophene) (PEDOT), PEDOT:PSS, poly(p-phenylene sulfide) (PPS), Poly(acetylene)s (PAC), Poly(p-phenylene vinylene) (PPV).

According to an embodiment of the invention, the light-emitting or light blocking layer of the claim can further comprise at least one touch sensitive region. In this embodiment, the touch sensitive region is at least one of the following: a touch sensitive region in at least one of the conductive or semi-conductive transparent electrodes; and one or more layers of flexible, formable, foldable, stretchable and/or bendable touch sensitive material.

The touch sensitive film or films can be all or part of, for instance, a capacitive sensor (e.g. surface capacitive or inductive, projective capacitive or inductive) as known in the art, a resistive sensor as known in the art, or a touch sensor as described in PCT/FI2011/050197, PCT/FI2012/050936 and PCT/FI2013/050129.

In other words, the film can possess touch responsive properties by means of a touch sensitive region in one of the electrodes, which can be the whole electrode or a part of it; or a touch sensitive region in both electrodes; or additional touch sensitive flexible and optically transparent layers laminated together with the essential 3-layer electrode/light-emitting layer-electrode stack of the light-emitting device or the essential light blocking-layers of a light transmitting/blocking device using, e.g. liquid crystals (liquid crystal, transparent electrodes and polarizers). This provides the possibility to create e.g. bendable touch sensors, or formable films that can be put around a complex 3D-shaped structure and still transmit electromagnetic radiation such as light and have touch sensitivity. As an example, the touch sensitive layers disclosed in publications WO2013045766 or WO2011107666 can be used as the flexible or formable touch sensitive layers.

The touch sensitive film is optically transparent, thus enabling use of the touch sensitive film as part of a luminaire or other lighting device according to the invention. Optical transparency of the touch sensitive film means here that at least 10%, preferably at least 90% of the incident radiation from a direction substantially perpendicular to the plane of the film, at the frequency/wavelength range relevant in the application at issue, is transmitted through the film. In most touch sensing applications, this frequency/wavelength range is that of visible light, however, other applications may require transparency in different parts of the electromagnetic spectrum.

Any or all of the layers of the device according to the invention can be patterned and/or independently driven by supporting electronics so as to pixilate or segment the surface into different regions which can be separately or collectively controlled via the touch surface through appropriate electronics and algorithms for e.g., driving, sensing and interpreting touch as are known in the art.

Input from the touch sensitive layer can be used to, for instance, adjust the properties (e.g. direction, brightness, color, focus, or beam angle) of the light emitted from the light-emitting layer or through the light blocking layer, or to turn on or off or to change operating mode (e.g. flashing rate or duration) of the light from the light-emitting layer or through the light-blocking layer. Note that the light-emitting or light-blocking layer may also include, for instance, a color filter to modify the color.

DETAILED DESCRIPTION OF THE EMBODIMENTS

Reference will now be made to the embodiments of the present invention, examples of which are illustrated in the accompanying drawings.

General functioning of a light-emitting device having an active layer and two electrodes, at least one of them being transparent, is described in the prior art. General functioning of a light-transmitting device having a light source, an active layer and two transparent electrodes is described in the prior art.

As an example of a film comprising HARMs according to an embodiment of the invention, the films comprising Nanobud layers are shown. It is obvious to a person skilled in the art that the films are not limited to Nanobuds and can be implemented with other HARM structures, or with, for instance, carbon nanotubes, graphene, polymers, nanowires and metal meshes.

Figure 1:
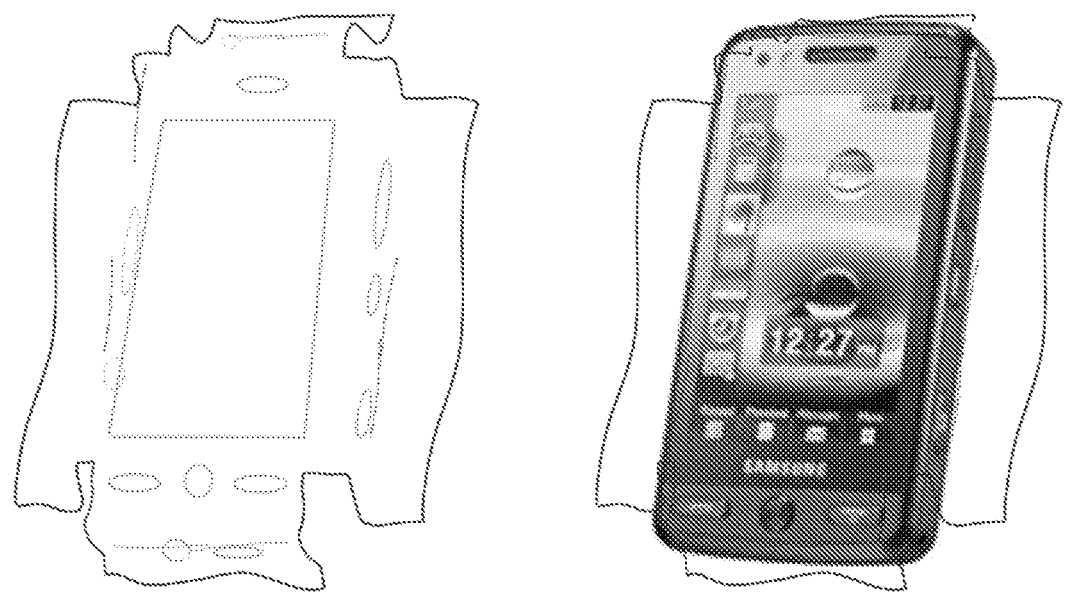
FIG. 1 shows a formable film according to an embodiment.

FIG. 1 shows the formable film according to one embodiment of the invention. It can be applied to e.g. a hand-held device.

Figure 2:
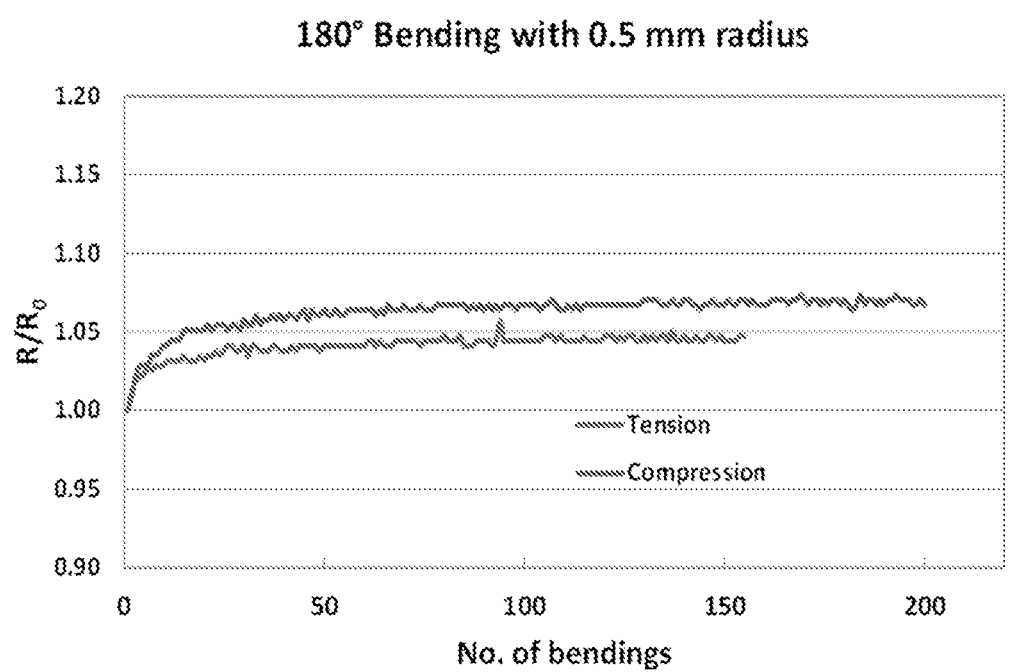
FIG. 2 is a graph showing bendability of the film according to an embodiment.

FIG. 2 is a graph showing outstanding bendability of a film based on Nanobuds, according to an embodiment of the present invention. In an embodiment of the invention, the film can be repeatedly flexed below 1 m radius of curvature and more preferably below 0.1 m radius of curvature and more preferably below 0.01 m radius of curvature and most preferably below 0.001 m radius of curvature while still remaining conductive.

Figure 3:
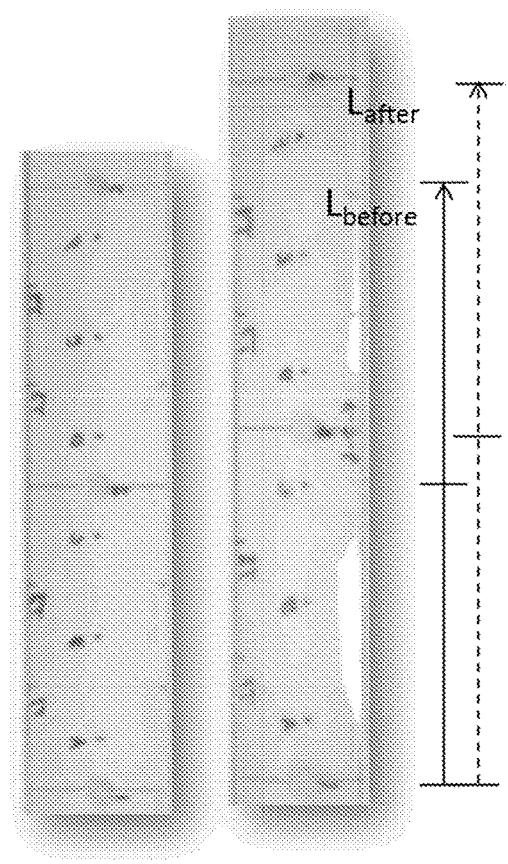
FIG. 3 shows the film according to an embodiment before and after stretching.

FIG. 3 is a graph showing exceptional stretching of a film based on Nanobuds, according to an embodiment of the present invention. In an embodiment of the invention, the film can be stretched flexed above 1% and more preferably above 2% and more preferably above 4% and more preferably above 8% and more preferably above 16% and more preferably above 32% and more preferably above 64% and most preferably above 128% while still remaining conductive.

Figure 4:
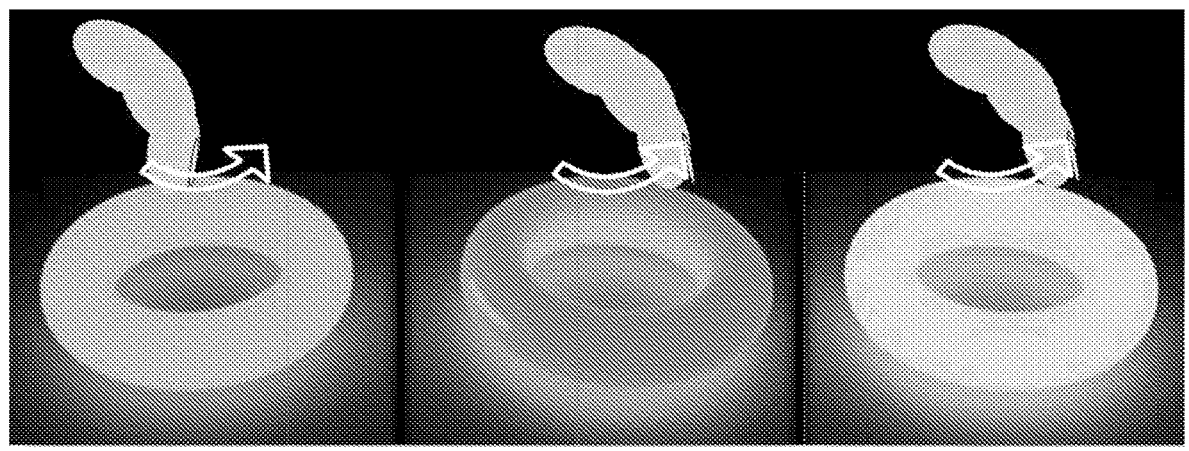
FIG. 4 shows an embodiment of the invention wherein the color and intensity of light emitted from or through a 3D surface is changed by touch input.

FIG. 4 is an image of an embodiment of the invention wherein touch input integrated into or onto the light-emitting structure is used to change the light distribution, brightness and color of a complex 3D light-emitting object covered with a flexible, stretchable formable light-emitting structure according to the invention.

Examples of touch gestures that can be used to control the light include but are not limited to single or multi finger hold (long touch on the touch surface), tap (short touch on the touch surface), or multi-tap to, e.g. turn on/off the light, single or multi-finger fast (swipe) or slow (slide or drag) movement over the touch surface to change the direction of the emitted light, double or multi-finger pinch or squeeze (moving the fingers closer together on the touch surface) to, e.g., narrow the light beam, multi-finger spread or stretch (moving the fingers farther apart from one another to, e.g., widen the light beam), rotating single or multi-touches about a point on the touch surface to, e.g., change the color, brightness, focus, and/or beam angle of the light.

The light emitting-layer or light-blocking layer, according to one embodiment of the invention, may be divided into multiple regions (e.g. pixels or segments). The light emitted from or blocked by each pixel may, according to one embodiment of the invention, be directed in a given direction. Changes in light focus and/or beam angle can be achieved by, for instance, turning on or off or brightening or dimming certain areas (pixels) of the light-emitting layer or light-transmitting layer.

Figure 5:
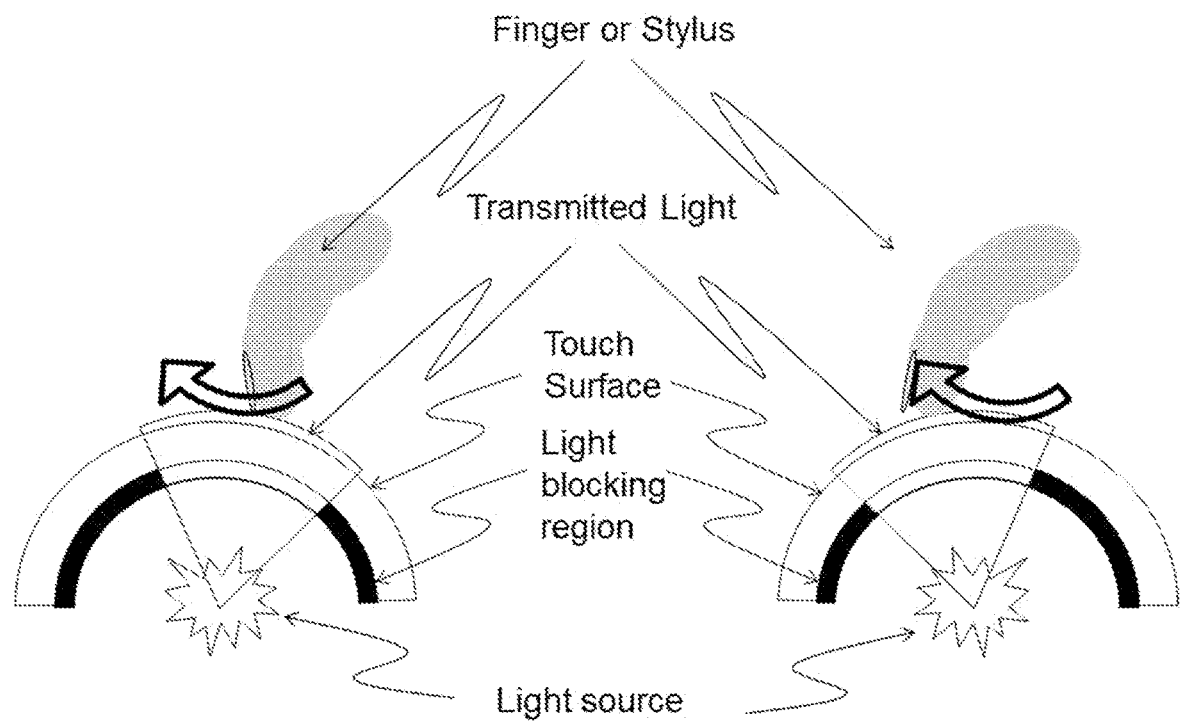
FIG. 5 shows a drag gesture according to the invention to change the direction of transmitted light from a light source through a light-blocking layer.
Figure 6:
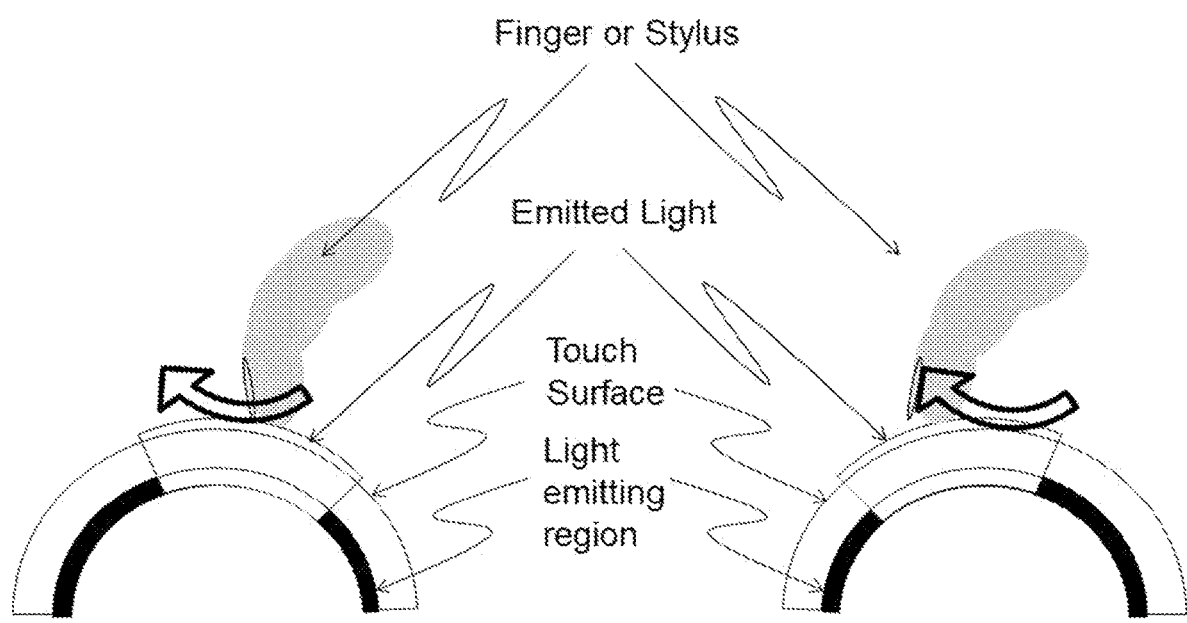
FIG. 6 shows a drag gesture according to the invention to change the direction of emitted light from a light emitting layer.

FIGS. 5 and 6 show embodiments of single finger slide or drag gestures used to direct light, either by blocking some portion of the transmitted light from a light source through a blocking layer (FIG. 5) or activate the appropriate emitting layers and so generate light in the selected direction (FIG. 6).

Figure 7:
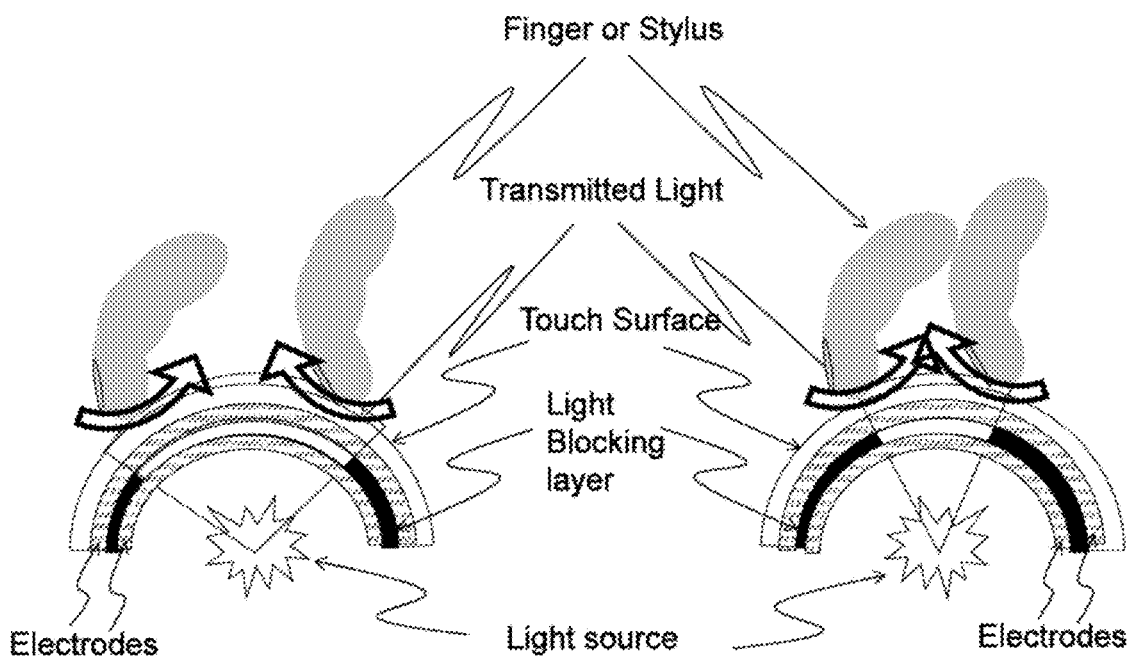
FIG. 7 shows a two-finger pinch gesture according to the invention to change the focus or beam angle of transmitted light from a light source through a light-blocking layer.
Figure 8:
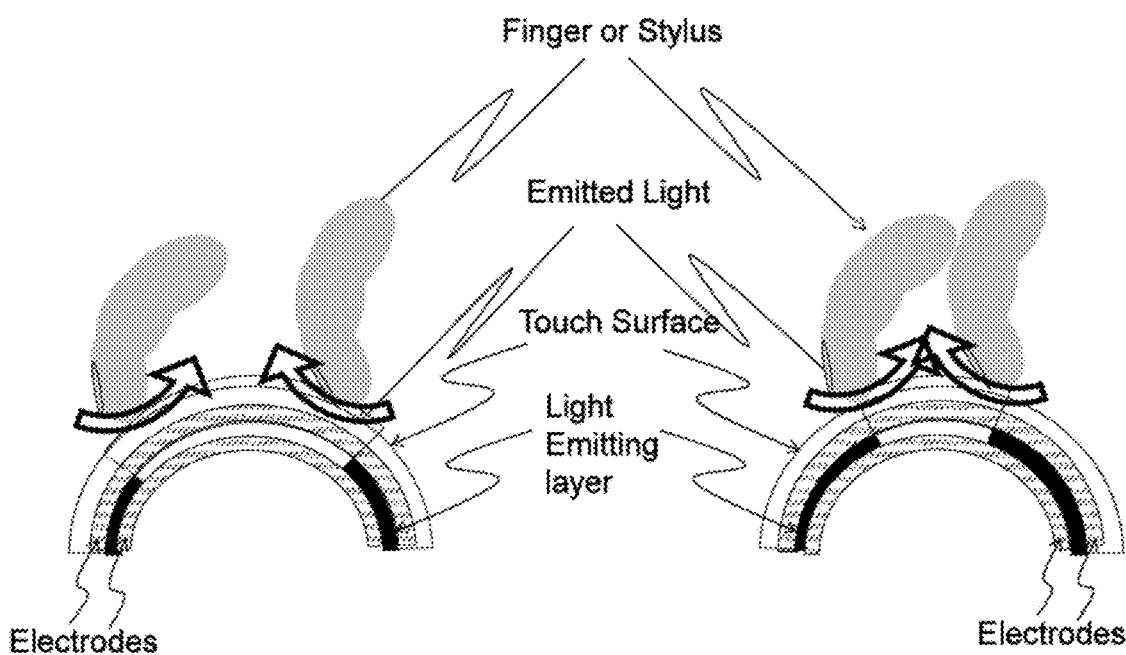
FIG. 8 shows a two-finger pinch gesture according to the invention to change the focus or beam angle of emitted light from a light source through a light-emitting layer.

FIGS. 7 and 8 show embodiments of a two finger pinch gesture in which fingers are brought closer together, used to focus light or narrow the beam angle, either by blocking some portion of the transmitted light from a light source through a blocking layer (FIG. 7) or activate the appropriate emitting layers and so generate light in the selected direction (FIG. 8). Similarly, moving (spreading or stretching) the fingers apart can be used to widen beam angle and/or reduce the focus. In other embodiments, these gestures can be used to, for instance, change the brightness or color of the emitted or transmitted light. This can be achieved by changing the frequency of the generated light or via an additional color filter in the stack below or above the touch surface.

The films according to embodiments of the present invention can also possess optical transparency.

Figure 9:
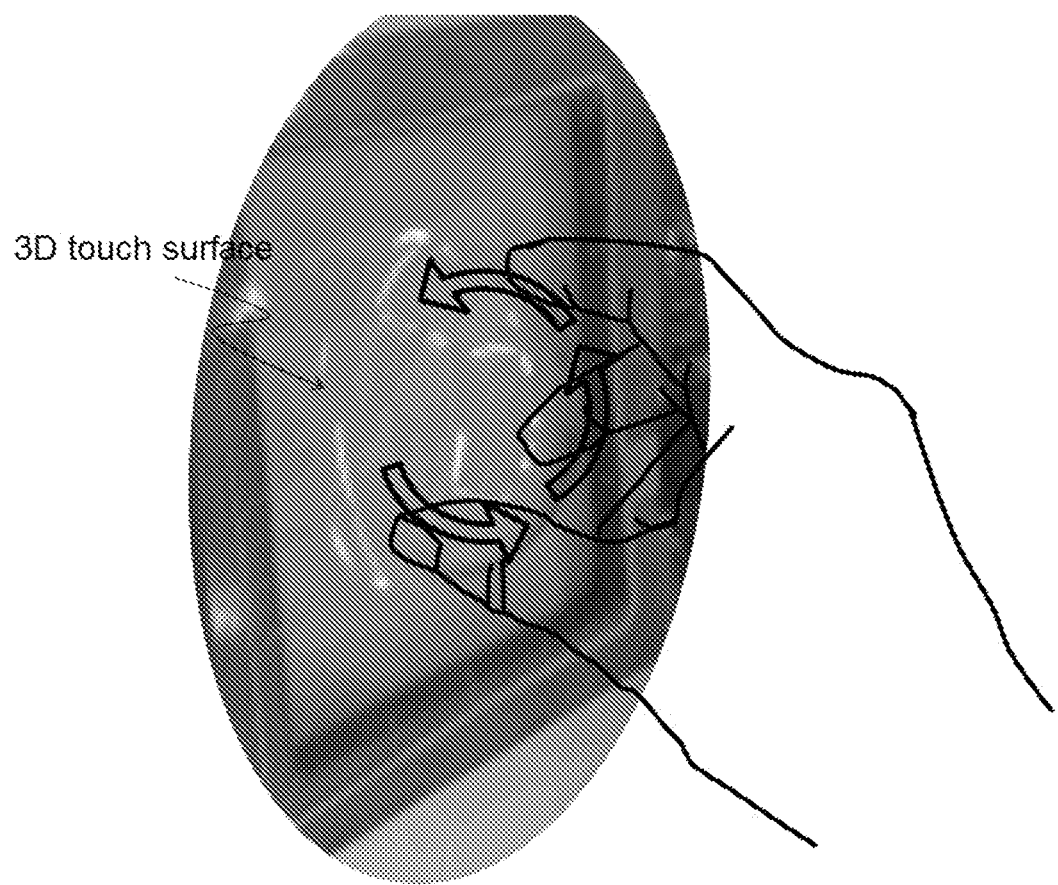
FIG. 9 shows a three-finger rotate gesture according to the invention to change, e.g., the brightness, color, focus or beam angle of emitted light from a light-emitting layer or transmitted light from a light source through a light-blocking layer.

FIG. 9 shows the touch surface of an embodiment of the present invention in which a three finger rotation gesture is used to, for instance, change the color, brightness, focus or beam angle of a transmitted or emitted light source. According to the invention, other gestures and numbers of fingers or styluses can be used to adjust these and other properties of the emitted or transmitted light.

The light source used in conjunction with the light-blocking layer or the light-emitting layer according to the invention may be any source of light known in the art including but not limited to incandescent light from, e.g. a resistively heated filament in a light bulb, spontaneous emission light from, e.g., light emitting diodes, neon lamps and mercury-vapor lamps, flames or other chemical reactions, stimulated emission light from, e.g., lasers and masers, visible radiation such as, e.g., cyclotron, synchrotron and bremsstrahlung radiation, chemical radiation such as fluorescence or bioluminescence, light produced by illumination or energetic radiation (such as fluorescence or phosphorescence) or subatomic particles (such as cathodolumenescence), electroluminescence, scintillation, sonoluminescence, or tribolumenescence. Other means of producing light are also possible according to the invention. In case the light source cannot be directly implemented in a flexible or formable format, it can be used as a light source to illuminate a flexible or formable film from one or more edges and guide some or all of the light out of the surface via, for instance, a flexible or formable diffuser.

A touch sensitive film (TSF) means, in general, a film which can be used as a touch sensitive element in a touch sensing device. A touch sensing device is to be understood here broadly to cover all user interface devices operated by touching the device e.g. by a fingertip or a stylus, as well as other types of devices for detecting the presence, location, and/or movement of one or more such fingers, pointers or other objects.

In the context of the present invention, the word "touch" is to be interpreted broadly, covering, in addition to true physical contact between a finger, stylus or other pointer and the touch sensitive film or touch surface, also situations where such pointer is brought to sufficiently close proximity to the TSF to be detected by it. Pointer, finger and stylus are here used interchangeably.

In operation, when a TSF is connected as a part of a suitably configured electrical measurement circuitry of a touch sensing device, a touch of one or more objects on the film, or the presence of one or more objects in the proximity of the film, causes a change in one or more electrical properties in the circuitry, based on which the touch can be detected and, depending on the application, preferably also its location on, proximity to, and/or movement across the touch sensing region determined. In practice, this change is typically detected by supplying an excitation signal to, and receiving a response signal from, the TSF, and monitoring the changes of the latter. Other means are possible according to the invention.

In general, the TSF of the present invention can form all or part of any type of touch sensor or touch sensing device incorporating a TSF, not being limited to the examples described below.

The TSF can be a capacitive TSF. A capacitive TSF means here a touch sensitive element by using which the detection of a touch can be primarily based on a capacitive sensing principle. A capacitive sensing principle or capacitive operation of a TSF means that, when the TSF is connected to a proper sensing circuitry, one or more touches can be detected based on the changes said touches cause in the capacitive coupling between the TSF and the ambient, or between different points of the TSF.

On the other hand, the TSF of the present invention can also operate inductively. By inductive operation is meant here, that an object induces an inductive coupling between the TSF and the ambient, or between different points of the TSF. In other words, capacitive or inductive coupling can also be seen as coupling to the TSF an external capacitance or inductance, respectively.

Also, the TSF of the present invention can operate resistively. By resistive operation is meant here, that an object causes a detectable change in the resistivity/current or voltage across an electrical pathway or a collection of pathways in a device containing one or more resistive films and this detectable change can then be converted into a location. Other touch sensors incorporating touch sensing films are known in the art.

Further, the TSF of the present invention is not limited to any particular detection principle but, instead, can be based on any detecting principle being based on the utilization of the conductive layer. Thus, the TSF can also be configured to detect touch-induced changes in e.g. resistance, voltage, phase angle, capacitance, induction or current. The detection can be based on, for example, the absolute or relative position or velocity of or pressure induced by a touching object.

A conductive layer is a layer formed of one or more electrically conductive materials. By "conductive" is meant here any material capable of allowing flow of electric charge in the material, irrespective of the conductivity mechanism or conductivity type of the material. Thus, "conductive" covers here, for instance, also semiconductive or semiconducting materials. In the operation of the TSF as a part of a touch sensing device, the excitation signals are supplied to and the response signals are measured from one or more conductive layers.

Possible groups of materials for the conductive layer are formed, for example, by different conductive polymers and metal oxides such as ITO, FTO or AZO. On the other hand, in one preferred embodiment, the conductive layer comprises a High Aspect Ratio Molecular Structure (HARMS) network. By HARMS or HARM structures is meant here electrically conductive structures with characteristic dimensions in nanometer scale, i.e. dimensions less than or equal to about 100 nanometers. Examples of these structures include carbon nanotubes (CNTs), carbon NANOBUD®s (CNBs), metal (e.g. silver, gold or copper) nanowires, and carbon nanoribbons. In a HARMS network, a great number of these kinds of single structures, e.g. CNTs, are interconnected with each other. In other words, at a nanometer scale, the HARM-structures do not form a truly continuous material, such as e.g. the conductive polymers or ITO, but rather a network of electrically interconnected molecules or structures. However, as considered at a macroscopic scale, a HARMS network forms a solid, monolithic material. As an essential feature, HARMS networks can be produced in the form of a thin layer.

The touch sensing region (TSR), i.e. the touch sensitive region within a conductive layer is the "active" or operating portion of the conductive layer, i.e. the region within which the actual touch sensing operation is to be performed. The TSR can also cover the entire area of the conductive layer. There can be one or more conductive layers in a TSF, and one conductive layer can have one or more TSRs. There may be also areas of the conductive layer which can sense touch, but are not used for sensing touch and thus are not considered TSRs in the meaning explained above.

In addition to the conductive layer, the TSF can comprise also other layers and structures needed to implement an entire working touch sensitive element. For example, there can be a substrate layer and/or one or more layers for mechanical protection of the film. Moreover, there can be also one or more layers for refractive index or color matching, and/or one or more coatings, for instance, for anti-scratch, layer spacing, decorative, self-cleaning, or other purposes. According to the invention, these layers can be in any order or location with respect to the conductive layer. Besides the layered elements, the TSF can also comprise three-dimensionally organized structures, e.g. contact electrodes and other contact structures or via extending through the TSF or a portion thereof. Though, for simplicity, these additional films and structures are not shown in the figures, they are included within the scope of the invention.

It is obvious to a skilled person that, with the advancement of technology, the basic idea of the invention may be implemented in various ways. The invention and its embodiments are thus not limited to the examples described above; instead they may vary within the scope of the claims.

The invention claimed is:

1. A light-emitting film comprising:
   a flexible and formable light-emitting active layer;
   two conductive or semi-conductive electrodes positioned on each side of the active layer, wherein at least one electrode is transparent and comprises at least one of the following: HARM-structures (High Aspect Ratio Molecular structures), Mono-Crystalline Surface (MCS) structures, conductive or semiconductive polymers, weaved metal fabric and a metal mesh; and
   at least one touch sensitive region, wherein the touch sensitive region comprises at least one of the following:
   a touch sensitive region in at least one of the conductive or semi-conductive transparent electrodes, and
   one or more layers of flexible and formable touch sensitive material,
   wherein the light-emitting film is configured to wrap around a complex three-dimensional surface.

2. The light-emitting film of claim 1, wherein the light-emitting active layer is selected from a group of: an organic light-emitting diode active layer, an electroluminescent layer, a field emission layer and a plasma layer or a layer comprising Light Emitting Diodes imbedded in or attached to a formable substrate.

3. The light-emitting film of claim 1, wherein the light-emitting active layer comprises multiple regions.

4. The light-emitting film of claim 1, wherein the touch sensitive region is a capacitive touch sensitive region.

5. The light-emitting film of claim 1, wherein the touch sensitive region is an inductive touch sensitive region.

6. The light-emitting film of claim 1, wherein the touch sensitive region is a resistive touch sensitive region.

7. The light-emitting film of claim 1, wherein each electrode comprises at least one of the following: HARM-structures (High Aspect Ratio Molecular structures), Mono-Crystalline Surface (MCS) structures, conductive or semi-conductive polymers, weaved metal fabric and a metal mesh.

8. A lighting device comprising a light-emitting film according to claim 1.

9. A light blocking film comprising:
   a flexible and formable light-blocking active layer;
   two conductive or semi-conductive electrodes positioned on each side of the light blocking active layer, wherein at least one electrode comprises at least one of the following: High Aspect Ratio Molecular (HARM) structures, Monolayer Crystalline Surface (MCS) structures, conductive or semiconductive polymers, weaved metal fabric and a metal mesh; and
   at least one touch sensitive region, wherein the touch sensitive region comprises at least one of the following:
   a touch sensitive region in at least one of the conductive or semi-conductive transparent electrodes, and
   one or more layers of flexible and formable touch sensitive material,
   wherein the light blocking film is configured to wrap around a complex three-dimensional surface.

10. The light-blocking film of claim 9, wherein the flexible and formable light-blocking active layer is a liquid crystal layer.

11. The light-blocking film of claim 9, wherein the light blocking active layer comprises multiple regions.

12. The light-blocking film of claim 9, wherein the touch sensitive region is a capacitive touch sensitive region.

13. The light-blocking film of claim 9, wherein the touch sensitive region is an inductive touch sensitive region.

14. The light-blocking film of claim 9, wherein the touch sensitive region is a resistive touch sensitive region.

15. A lighting device comprising a light-blocking film according to claim 9 and a light source.

16. The light-blocking film of claim 9, wherein each electrode comprises at least one of the following: HARM-structures (High Aspect Ratio Molecular structures), Mono-Crystalline Surface (MCS) structures, conductive or semi-conductive polymers, weaved metal fabric and a metal mesh.

* * * * *